United States Patent
Chong

(10) Patent No.: US 6,472,331 B1
(45) Date of Patent: Oct. 29, 2002

(54) METHOD AND APPARATUS FOR MEASURING AND DISPENSING A WAFER ETCHANT

(75) Inventor: Kam Beng Chong, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/392,394

(22) Filed: Sep. 9, 1999

(51) Int. Cl.[7] ............................................. H01L 21/302
(52) U.S. Cl. ...................... 438/745; 438/753; 438/756; 156/345.11; 156/345.18
(58) Field of Search ............................. 438/745, 753, 438/756; 156/345.11, 345.18

(56) References Cited

U.S. PATENT DOCUMENTS

| | | | | |
|---|---|---|---|---|
| 4,721,393 A | * | 1/1988 | Kwast ........................ 366/341 |
| 4,967,777 A | * | 11/1990 | Takayama et al. .......... 134/102 |
| 5,089,084 A | | 2/1992 | Chhabra et al. ............ 156/646 |
| 5,656,097 A | * | 8/1997 | Olesen et al. ................ 134/1 |
| 5,885,403 A | * | 3/1999 | Cheng ........................ 156/345 |
| 5,908,509 A | * | 6/1999 | Olesen et al. ............... 134/1.3 |

* cited by examiner

*Primary Examiner*—Gregory Mills
*Assistant Examiner*—Charlotte A. Brown
(74) *Attorney, Agent, or Firm*—George O. Saile; Rosemary L. S. Pike; William Robertson

(57) ABSTRACT

A tank is set up to hold a precise volume of acid by first adjusting an overflow pipe to establish a volume that is larger than the desired volume and then adjusting the vertical position of a volume occupying element that extends above and below the surface of the acid. The apparatus includes a drain pipe for directing the acid to a tank that holds deionized water that the acid is mixed with. The bath is used for etching a silicon dioxide layer on a semiconductor wafer.

4 Claims, 1 Drawing Sheet

METHOD AND APPARATUS FOR MEASURING AND DISPENSING A WAFER ETCHANT

FIELD OF THE INVENTION

Figure 1:
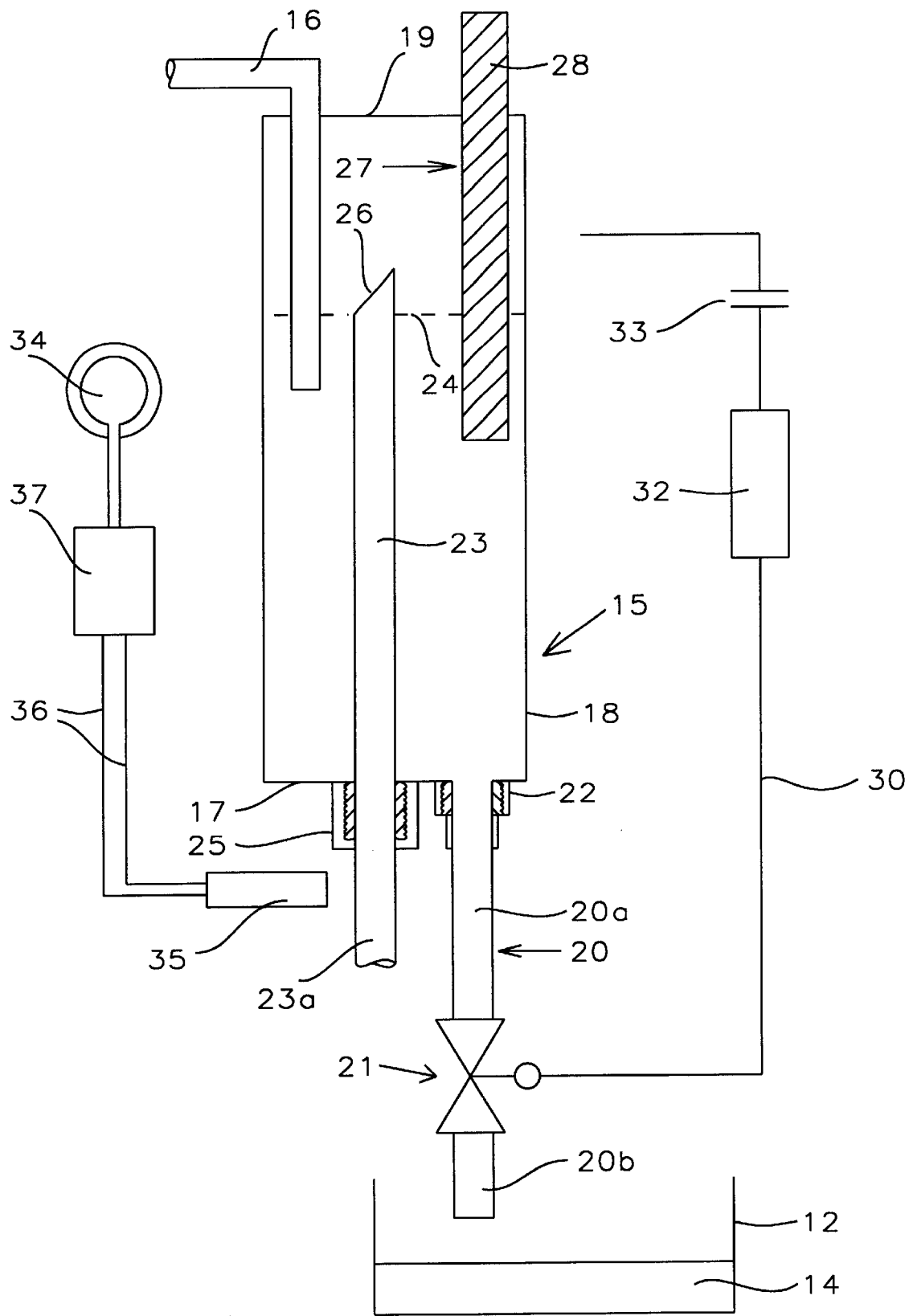

This invention relates generally to the manufacture of circuit devices on a semiconductor wafer and more specifically to a method and apparatus for dispensing a specified amount of an acid component of an etchant bath.

BACKGROUND OF THE INVENTION

In one familiar step in manufacturing a semiconductor wafer, a silicon dioxide layer on the wafer is etch with an etchant, commonly hydrofluoric acid. The etch rate varies with the concentration of the acid, and the acid is diluted with deionized water to a concentration that is appropriate for a particular etching operation.

Therefore, it is a common goal in this art to produce a solution of hydrofluoric acid and deionized water having a predefined concentration.

In a specific manufacturing technique that this invention is intended for, the wafers are placed in a bath formed by a solution of hydrofluoric acid and deionized water. This bath is held in a tank. This familiar environment will be used for illustrating the invention. The acid and the deionized water are mixed in the bath. In one practice, a specified amount of deionized water is first added to the bath and then a specified volume of acid is added.

A bath is used for a number of wafers and is then replaced. Thus, the preparation of this acid solution is a continuing task in wafer manufacture.

In the preferred manufacturing environment, the solution has 50 parts of deionized water to one part hydrofluoric acid. As a more specific example, the volume of the bath (both acid and deionized water) is 26.5 liters and the volume of hydrofluoric acid is 0.540 liters. The intended accuracy of the acid volume is +−5 milliliters (0.005 liter).

With this high ratio of water to acid, the desired amount of water can be measured easily with any convenient means of reasonable accuracy, but the acid volume must be established very precisely. Thus, one recognized goal in this art is to supply a precise volume of acid to the bath.

THE PRIOR ART

In concept, the acid could be measured by hand, using familiar laboratory measuring apparatus. However, a more automated technique is needed for a manufacturing environment.

The prior art has suggested using metering valves to supply precise amounts of deionized water and hydrofluoric acid to the tank that holds the bath. However, these valves are inaccurate if the pressure is not kept constant, and they require frequent replacement at a significant expense.

SUMMARY OF THE INVENTION

According to this invention, a tank is adapted to hold the acid and is provided with an adjustable overflow pipe. The overflow level is set to provide a volume that is slightly larger than the volume of acid that is to be supplied to the bath. The tank also has a vertically adjustable volume occupying element that reduces the volume of acid that can be held below the overflow level. The preferred volume occupying element is a rod that is threadably supported in the tank. Turning the rod raises or lowers it and thereby changes the volume at a rate that permits simple adjustments.

The tank is small and is easily located in a manufacturing line over the tank holding the acid bath.

Other objects and features of the invention will appear in the description of the preferred embodiment of the invention.

THE DRAWING

FIG. 1 is a schematic diagram of the apparatus of this invention.

THE PREFERRED EMBODIMENT

The Apparatus of FIG. 1—Introduction

A tank 12 holds a bath 14 of hydrofluoric acid diluted with deionized water. The tank and bath are conventional and are shown schematically in FIG. 1. Apparatus that is conventional and not shown in the drawing carries a wafer to the bath and immerses the wafer for a sufficient time to perform a selected etch operation on silicon dioxide exposed at the surface of the wafer. As already explained, the amount of etching is a function of both the time the wafer is subjected to the etchant and the concentration of the etchant.

A suitable supply of deionized water is provided, and a selected amount is placed in tank 12 before the apparatus of this invention is used to dispense the acid.

The Measuring and Dispensing Tank

My novel measuring and dispensing apparatus includes a tank that is constructed to hold a selected volume of hydrofluoric acid and to permit an easy adjustment to this volume. Tank 15 and other components that contact the acid are made of acid resistant materials or are coated with acid resistant materials, as will be readily understood.

The preferred tank has a square bottom wall 17 that is 6 centimeters on a side and rectangular side walls 18 that are 19 centimeters high. The preferred tank also has a top 19. These dimensions provide a volume of 686 cubic centimeters (0.686 liters). These values illustrate the requirement that the volume of the tank is greater than the volume of acid (0.540 liters in the related earlier example).

From a more general standpoint, the volume of acid will be selected in relation to the volume of the bath 14 and the desired concentration. The invention can be understood most easily from the more limited approximation that the preferred volume of acid tank in 15 is on the order of one half liter and the total tank volume is on the order of one liter.

The Acid Filling and Dispensing Apparatus

In concept, the acid can be poured into tank 15 from a bottle containing the acid, but preferably the acid is supplied through a pipe 16 that is connected to any convenient supply of the acid. Pipe 16 may be supported by a conventional attachment to the top 19 of tank 15, represented schematically.

The acid is dispensed from tank 15 through a pipe 20 and a drain valve 21. Pipe 20 has an upper section 20a that is attached to the bottom 17 of the tank 15 by means of a fitting 22, and it has a lower section 20b that extends from the outlet side of valve 21 to a convenient position above the tank 12 that holds the etching bath 14. A control system for drain valve 21 will be described later.

The volume of tank 15 includes the volume of upper pipe section 20a.

The Acid Level Control System

An overflow pipe 23 allows excess acid to flow out of the tank and it thereby defines the level of acid in the tank. This level is shown by a dashed line 24. Pipe 23 is attached to the bottom of tank 15 by a fitting 25 that is releasable to allow pipe 23 to be raised or lowered to set overflow line 24 to a desired level. The position of line 24 defines a maximum volume of acid in the tank (including the acid in upper pipe section 20a), as will be explained later. Other volumes that are slightly different will also be explained later.

As FIG. 1 shows, the upper rim 26 of overflow pipe 23 is preferably slanted so that acid flows into the pipe until level 24 falls to the lowest point along the rim. This construction provides a more precise definition of level 24.

Ordinarily, the excess acid that overflows pipe 23 will be collected and reused, and a section 23a of overflow pipe 23 extends below fitting 25. The schematic break in the drawing of this pipe represents that the collection apparatus is independent of tank 15 and the associated the apparatus.

The volume of acid defined by the overflow line 24 is a precise value, and at least in concept the vertical position of overflow pipe 23 can be adjusted to locate the line 24 at a level for a desired volume of acid. However, it is sometimes necessary to make small increases or decreases in the percentage of acid when the bath is replaced, and these changes may be difficult to make by positioning the overflow pipe because access to pipe 23 and fitting 25 may be blocked by nearby components of the wafer manufacturing line. If the pipe and fitting are accessible, it may be time consuming to change the volume by adjusting pipe 23.

The Volume Adjusting Apparatus

A volume adjustment mechanism 27 is located to occupy a selected volume below the overflow line 24, and it permits the tank volume to be adjusted to a specified value.

As FIG. 1 shows, the volume adjusting apparatus comprises a threaded rod 28 that is held in a suitable support, such as the top 19 of tank 15, having complementary threads. The rod extends both above and below overflow line 24. As the rod is turned (preferably by hand), it extends farther below overflow line 24 or it is raised from this position, and a small volume is displaced from the tank or added to the tank volume.

The volume adjusting mechanism 27 is adapted to provide a suitable range of variation in the volume of tank 15. Giving the threaded rod a greater diameter provides more displacement for each turn. The displacement for one turn can be calculated from the diameter of the rod and the pitch of the threads. The apparatus will operate easily with a wide range in the diameter and length of rod 28, and the drawing shows these components to an approximate scale for the preferred apparatus.

Giving the rod a greater threaded length also increases the range of displacement. If it is expected that the position of overflow level line 24 will be changed significantly, the threaded part of the rod is extended or the rod is otherwise adapted to extend across any expected overflow level.

The Valve Control System

Preferably, drain valve 21 is a conventional pneumatically operated valve, actuated by compressed air in a line 30. The compressed air in line 30 is controlled by a solenoid valve 32 that is controlled by relay having contacts 33 that are actuated by a coil 34. These components are conventional and are shown schematically in FIG. 1.

A proximity sensor 35 is located to sense the flow of acid in overflow pipe section 23a. These sensors are well known and a detailed description is not required; commonly they include capacitor electrodes that respond to the difference in dielectric constant between the acid and the air that otherwise occupies pipe section 23a.

When the tank has been filled with acid to line 24 and acid begins to flow in pipe section 23a, proximity sensor 35 produces a signal on a line 36 to start a timer 37. Timer 37 produces a signal to energize the relay coil 34 and open solenoid valve 32 and pneumatic valve 21 for a time that is sufficient to drain tank 15. At then end of this time period, coil 34 is de-energized and valve 21 is closed.

Setting up Tank 14

A person initially setting up the tank to hold a preselected volume of acid can select the appropriate position for level 24 in any suitable way. (The volume corresponding to this level is only required to be somewhat larger than the desired volume of acid, within the range of volume change that can be produced by rod 25.) For example, the position can be calculated from the dimensions of tank 15, or a known volume of water can be put in the tank.

The fitting 25 for overflow pipe 23 is then released, overflow pipe 23 is positioned with the lowest point of its rim 26 at the selected position for line 24, and fitting 25 is tightened to seal the overflow pipe to the bottom of the tank and to lock it in the selected position. This technique can be used to establish the position of line 24 for a selected volume, or the tank can be marked to show several volumes from a succession of these measurements.

The volume occupying rod 28 is then adjusted to give the tank a selected volume. One way to make this adjustment is to raise rod 28 to a high position, place the desired volume of water in the tank, and then lower the rod until the level rises to the overflow point.

Ordinarily, the volume occupying rod 28 will be given a vertical range that will cover expected changes in the concentration of the acid bath 14, and the initial setting of the overflow position will remain fixed unless a greater change in the acid concentration is required. The position of rod 28 can be easily repositioned to adjust the concentration within this range.

OTHER EMBODIMENTS

Specific examples have been used to make the description of the invention easier to understand, and those skilled in the art will recognize appropriate modifications for a particular application, within the spirit of the invention and the scope of the claims.

What is claimed is:

1. A method for forming an acid bath for etching a semiconductor wafer, comprising the following steps, providing a tank for holding the acid component of the bath, providing an overflow pipe for the tank and thereby establishing an overflow level at which an acid added to the tank overflows the pipe, the overflow level defining an overflow volume of acid that can be contained inside the tank below the overflow level, the overflow volume being larger than the volume of acid to be supplied to the bath, locating a volume occupying element inside the tank at a position where the volume occupying element extends above and below the overflow level, and adjusting the position of the volume occupying element with respect to the overflow level to provide said volume of acid to be supplied to the bath when the tank is filled to the overflow level, and emptying the tank into a bath containing the water component of the acid bath.

2. The method of claim 1 wherein the method includes adjusting the position of the overflow pipe to establish the overflow volume.

3. The method of claim 2 wherein the method of adjusting the overflow pipe comprises releasing a fitting connecting the pipe to the bottom of the tank, moving the pipe to a new position and refastening the fitting.

4. The method of claim 3 wherein the tank has a pipe and a valve for controlling the flow of acid from the tank to the bath and wherein the step of emptying the tank comprises detecting the flow of acid in the overflow pipe when the tank has been filled to the overflow level, opening the valve for a fixed time sufficient to empty the tank, and then closing the valve.

* * * * *